US006595022B2

(12) United States Patent
Pokharna et al.

(10) Patent No.: US 6,595,022 B2
(45) Date of Patent: Jul. 22, 2003

(54) COMPUTER SYSTEM HAVING A REFRIGERATION CYCLE UTILIZING AN ADSORBER/DESORBER FOR PURPOSES OF COMPRESSION

(75) Inventors: Himanshu Pokharna, San Jose, CA (US); Eric Distefano, Livermore, CA (US); Joseph D. Walters, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/894,192

(22) Filed: Jun. 27, 2001

(65) Prior Publication Data

US 2003/0000231 A1 Jan. 2, 2003

(51) Int. Cl.[7] .............................. F25B 17/08; H05K 7/20
(52) U.S. Cl. .............................. 62/480; 62/141; 361/688
(58) Field of Search ........................ 62/480, 476, 477, 62/478, 481, 101, 106, 141; 165/104.12, 104.21, 274; 361/688, 690

(56) References Cited

U.S. PATENT DOCUMENTS

| 4,694,659 | A | * | 9/1987 | Shelton | 62/106 |
|---|---|---|---|---|---|
| 4,765,395 | A | * | 8/1988 | Paeye et al. | 62/480 X |
| 4,881,376 | A | * | 11/1989 | Yonezawa et al. | 62/106 |
| 4,976,117 | A | * | 12/1990 | Crozat et al. | 62/480 |
| 5,161,389 | A | * | 11/1992 | Rockenfeller et al. | 62/480 |
| 5,396,775 | A | * | 3/1995 | Rockenfeller et al. | 62/480 X |
| 5,477,706 | A | * | 12/1995 | Kirol et al. | 62/480 |
| 5,855,119 | A | * | 1/1999 | Pfister et al. | 62/259.2 |
| 6,109,039 | A | * | 8/2000 | Hougham et al. | 62/259.2 |
| 6,118,654 | A | * | 9/2000 | Bhatia | 361/687 |
| 6,155,073 | A | * | 12/2000 | Gray | 62/480 |
| 6,349,553 | B1 | * | 2/2002 | Pfister et al. | 62/259.2 |

\* cited by examiner

*Primary Examiner*—Chen Wen Jiang
(74) *Attorney, Agent, or Firm*—Blakely, Sokoloff, Taylor & Zafman LLP

(57) ABSTRACT

A computer system is described having a refrigeration cycle for a logic processor each utilizes first and second refrigeration cycles, each including a respective adsorber/desorber. Each adsorber/desorber is alternatingly cooled and heated. A liquid is adsorbed into the adsorber/desorber when being cooled and desorbed when the adsorber/desorber is heated. When the liquid is desorbed from the adsorber/desorber, and a checkvalve is closed, a pressure of the liquid increases. The adsorber/desorber together with the checkvalve act as a compressor in the respective refrigeration cycle. Heating and cooling is alternated so that one adsorber/desorber always adsorbs liquid while the other adsorber/desorber desorbs liquid. Thermal swings of the logic processor are thereby avoided.

19 Claims, 3 Drawing Sheets

COMPUTER SYSTEM HAVING A REFRIGERATION CYCLE UTILIZING AN ADSORBER/DESORBER FOR PURPOSES OF COMPRESSION

BACKGROUND OF THE INVENTION

1). Field of the Invention

This invention relates to a computer system and cooling thereof.

2). Discussion of Related Art

Computer systems often include logic processors which, when operated, generate large amounts of heat. Numerous devices exist for cooling such logic processors including computer fans, and heat sinks having fins providing large surface areas for convecting heat therefrom. Such devices transfer heat from the logic processor at a high temperature to ambient air and room temperature. The amount of heat that can be transferred generally depends on the ambient room temperature when using such devices.

More heat can be transferred to temperatures below ambient room temperature. Refrigeration cycles are required to obtain temperatures below ambient room temperature. A refrigeration cycle however generally includes a compressor having moving parts which can break or leak. A compressor also has to be driven by an electric motor that also has moving parts that can break.

BRIEF DESCRIPTION OF THE DRAWINGS

The invention is further described by way of examples with reference to the accompanying drawings wherein.

DETAILED DESCRIPTION OF THE INVENTION

Figure 1:
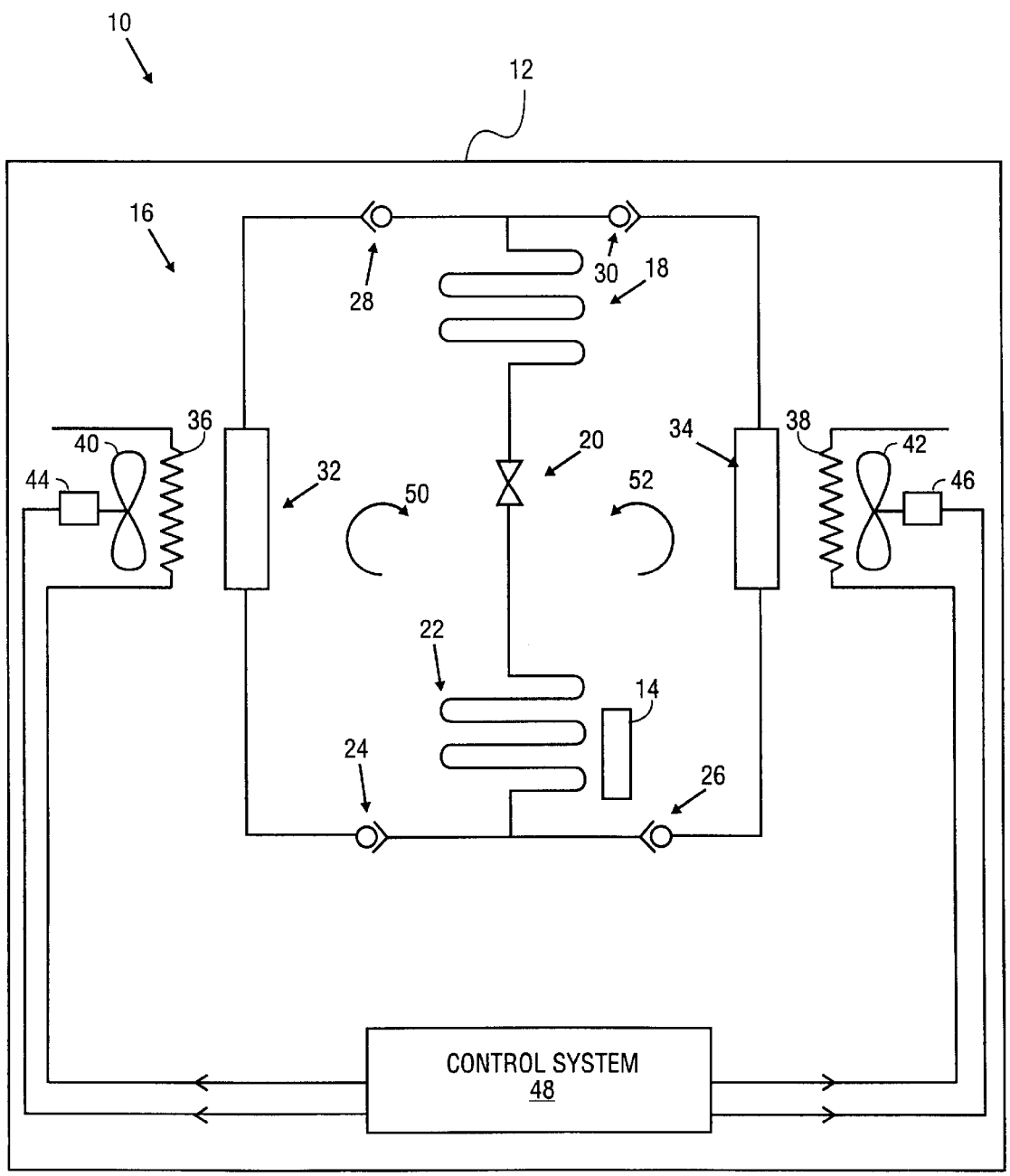
FIG. 1 is a plan view of components of a computer system, according to an embodiment of the invention, having a computer housing and internal refrigeration apparatus.

FIG. 1 of the accompanying drawings illustrates a computer system 10 according to an embodiment of the invention including a computer housing 12, a logic processor 14, and refrigeration apparatus 16. The logic processor 14 and the refrigeration apparatus 16 are mounted to the computer housing 12 in an internal volume of the computer housing 12.

The refrigeration apparatus 16 includes first, second, third, and fourth checkvalves 24, 26, 28, and 30 respectively, a first adsorber/desorber 32, a second adsorber/desorber 34, first and second resistive heaters 36 and 38 respectively, first and second fans 40 and 42 respectively, first and second motors 44 and 46 respectively, and a control system 48.

The evaporator 22 is located against or in close proximity to the processor 14, thereby thermally coupling the evaporator 22 to the processor 14. Heat generated by the processor 19 is transferred from the processor 14 to the evaporator 22.

The condenser 18, expansion valve 20, evaporator 22, first checkvalve 24, first adsorber/desorber 32, and third checkvalve 28 are located sequentially after one another to form a first refrigeration cycle 50. The condenser 18, expansion valve 20, evaporator 22, second checkvalve 26, second adsorber/desorber 34, and fourth checkvalve 30 are located sequentially after one another to form a second refrigeration cycle 52. The condenser 18, expansion valve 20, and evaporator 22 are common to both refrigeration cycles 50 and 52.

The fans 40 and 42 are connected to the motors 44 and 46 respectively. The control system 48 can provide current individually to the motors 44 and 46 and to the resistive heaters 36 and 38. The resistive heaters 36 and 38 are located in proximity to the first adsorber/desorber 32 and second adsorber/desorber 34 respectively and the fans 40 and 42 are located in proximity to the first adsorber/desorber 32 and second adsorber/desorber 34 respectively.

Electric current flowing through the heater 36 causes the heater 36 to heat up and heats the first adsorber/desorber 32 because of the proximity of the heater 36 to the first adsorber/desorber 32. The second heater 38 heats the second adsorber/desorber 34 in a similar manner.

When current is provided to the first motor 44, the first motor 44 rotates the first fan 40. The first fan 40 then blows air over the first adsorber/desorber 32, thereby accelerating convection of heat on the first adsorber/desorber 32. The second electric motor 46 and second fan 42 operate in a similar manner to cool the second adsorber/desorber 34.

The control system 48 may be a very simple device such as a timer which switches current back and forth between first and second modes. In the first mode current is provided to the first electric motor 44 and the second resistive heater 38. In the second mode current is provided to the first resistive heater 36 and to the second electric motor 46. In the first mode, therefore, the first adsorber/desorber 32 is cooled and the second adsorber/desorber 34 is heated and in the second mode the first adsorber/desorber 32 is heated and the second adsorber/desorber 34 is cooled. The refrigeration apparatus 16 alternates back and forth between the first and second modes, each time operating in one of the modes for about thirty seconds before switching to the other mode, depending on load.

Figure 2:
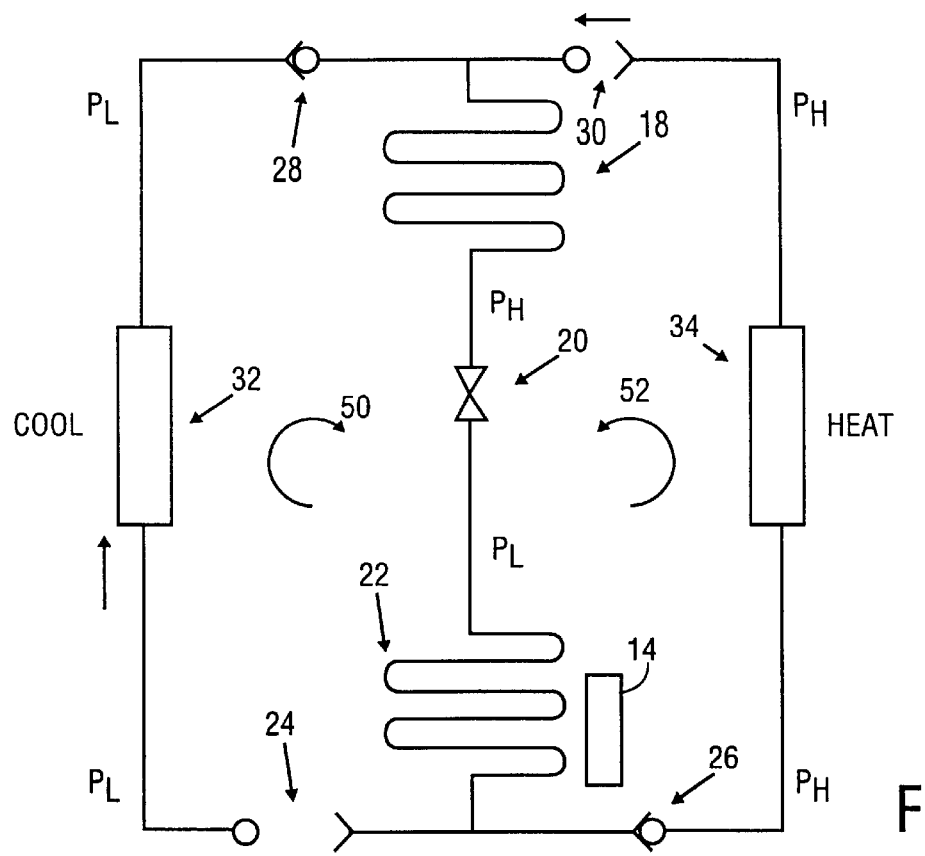
FIG. 2 is a plan view of some of the components illustrated in FIG. 1 and illustrates a first mode of operation of the refrigeration apparatus.
Figure 3:
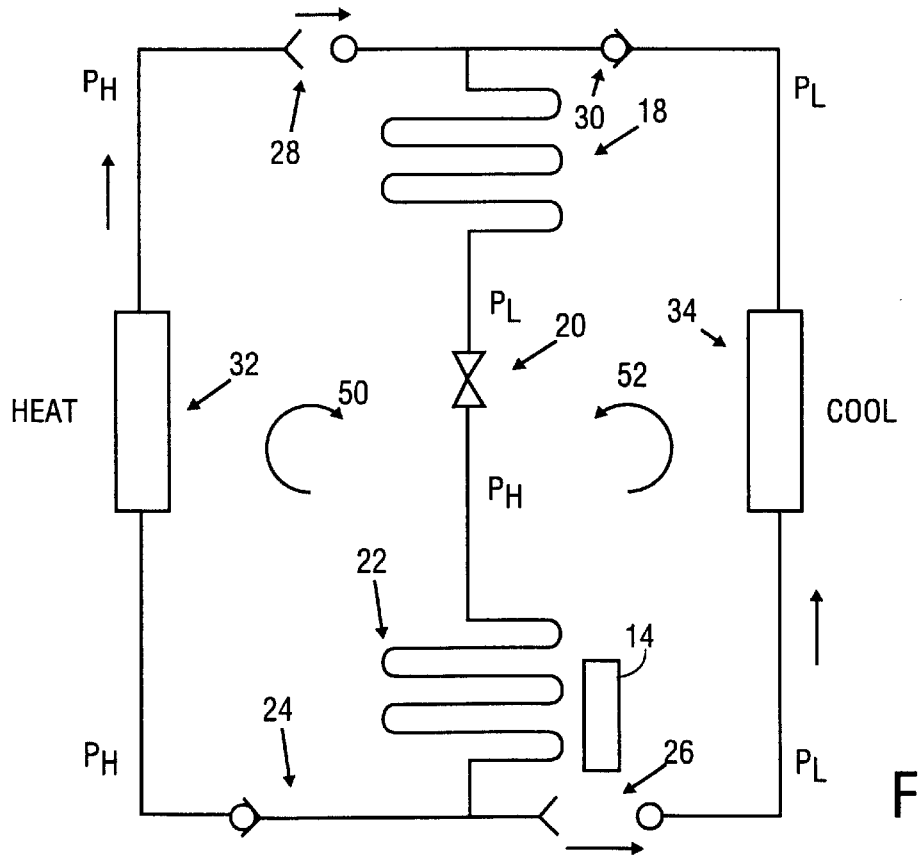
FIG. 3 is a view similar to FIG. 2 illustrating a second mode of operation of the refrigeration apparatus which is alternated with the first mode of operation.

FIGS. 2 and 3 now respectively illustrate operation of the refrigeration cycles 50 and 52 in the first and second modes respectively.

Referring to FIG. 2, the first adsorber/desorber 32 is cooled and the second adsorber/desorber 34 is heated. Cooling of the first adsorber/desorber 32 causes a vapor located between the first adsorber/desorber 32 and the first checkvalve 24 to be adsorbed into the first adsorber/desorber 32. Adsorption of the vapor reduces a pressure of the vapor. A reduction in pressure of the vapor closes the third checkvalve 28 and opens the first checkvalve 24. The evaporator 22, first checkvalve 24, and first adsorber/desorber 32 are then all at a low pressure $P_L$. The thirty-second time window during which the first adsorber/desorber 32 is cooled is sufficient to substantially saturate the first adsorber/desorber 32 with vapor flowing from the evaporator 22.

Heating of the second adsorber/desorber 34, causes a vapor, previously adsorbed into the second adsorber/desorber 34, to be desorbed from the second adsorber/desorber 34. Desorbing of the liquid from the second adsorber/desorber 34 at a higher temperature causes an increase in pressure of the liquid. An increase in pressure in the liquid from the second adsorber/desorber 34 closes the second checkvalve 26 and opens the fourth checkvalve 30. The second adsorber/desorber 34 and the condenser 18 are then at a high pressure $P_H$.

The combined effect of desorbing of the vapor and closing of the second adsorber/desorber 34 and closing of the valve 26 thus act to compress the liquid to a high pressure $P_H$. Compression of the liquid to the high pressure $P_H$ also increases the temperature of the liquid. The liquid adsorbed from the second adsorber/desorber 34 flows through the fourth checkvalve 30 into the condenser 18. Heat is radiated and convected from the condenser 18, thereby changing the phase from vapor to liquid. The liquid then flows from the condenser 18 through the expansion valve 20. The liquid is expanded by the expansion valve 20 to the low pressure $P_L$ with a corresponding reduction in temperature of the liquid to below the processor operating temperature. The liquid then flows through the evaporator 22. Heat is transferred from the processor 14 to the liquid in the evaporator 22, causing the liquid to evaporate before flowing through the first checkvalve 24.

It can thus be seen that the refrigeration cycle 52 serves to cool the processor 14 while more of the vapor is adsorbed into the first adsorber/desorber 32. Adsorption into the first adsorber/desorber 32 prepares the first adsorber/desorber 32 together with the first checkvalve 24 to act as a compressor in the first refrigeration cycle 50.

FIG. 3 now illustrates operation of the refrigeration apparatus 16 in the second mode. The first adsorber/desorber 32 is heated so that vapor previously adsorbed therein is desorbed therefrom. Desorption of the vapor from the first adsorber/desorber 32 causes an increase in pressure of the vapor being desorbed from the low pressure $P_L$ to the high pressure $P_H$. The high pressure $P_H$ closes the first checkvalve 24 and opens the third checkvalve 28. The first adsorber/desorber 32, third checkvalve 28 and condenser 18 are then all at the high pressure $P_H$. The vapor flows through the condenser 18 which cools it to change its phase to liquid. The liquid is then expanded by the expansion valve 20, causing a reduction in temperature thereof before flowing through the evaporator 22. Heat is transferred from the processor 14 to the liquid in the evaporator 22, causing it to evaporate.

Cooling of the second adsorber/desorber 34 causes a reduction in pressure to a low pressure $P_L$. The low pressure $P_L$ opens the second checkvalve 26 and closes the first checkvalve 30. The vapor flows from the evaporator 22 through the second checkvalve 26 and is adsorbed into the second adsorber/desorber 34.

The first adsorber/desorber 32 together with the first checkvalve 24 thus act as a first compressor and the second adsorber/desorber 34 together with the second checkvalve 26 act as a second compressor. The moving parts of compressors are however avoided.

It can thus be seen that, by alternating between the first and second modes of FIGS. 2 and 3, heat is constantly transferred to the evaporator 22. Thermal cycling of the processor 14 is thereby avoided.

Figure 4:
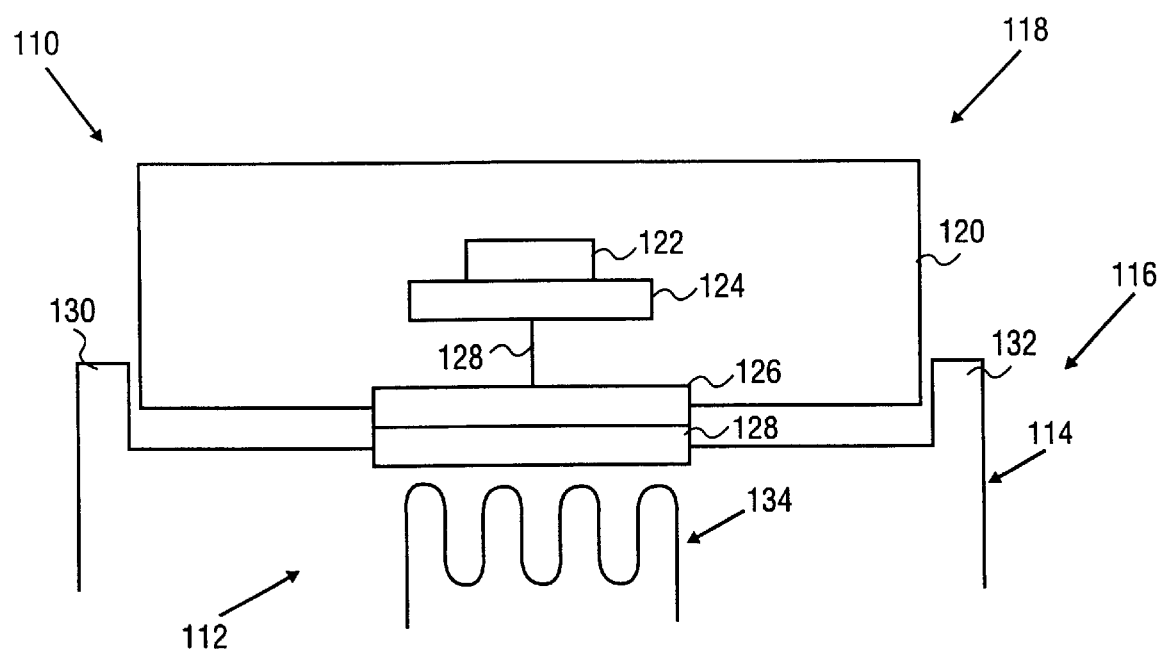
FIG. 4 is a cross sectional side view of a computer system according to another embodiment of the invention having a refrigeration apparatus in a docking station.

The computer system 10 illustrated in FIG. 1 may for example be a mobile computer wherein the computer housing 12 is a mobile computer housing. FIG. 4 illustrates an alternative computer system 110 having refrigeration apparatus 112 located within and mounted to a docking station housing 114 of a docking station 116. The computer system 110 includes a mobile computer 118 having a mobile computer housing 120 with a logic processor 122 mounted within and to the mobile computer housing 120. A heat plate 124 is located against the processor 122 and a thermal plate 126 is thermally coupled to the heat plate 124 through a heat pipe 128. Heat is transferred from the processor 122 through the heat plate 124 and the heat pipe 128 to the thermal plate 126. Another thermal plate 128 is mounted to the docking station housing 114. The mobile computer housing 120 is engageable within a formation 132 of the docking station housing. Engagement of the mobile computer housing 120 with the docking station housing 114 results in high-pressure contact between the thermal plates 126 and 128. An evaporator 134 is mounted within and to the docking station housing 114. The evaporator 134 is located against the thermal plate 128 so that heat is transferred from the thermal plate 126 through the thermal plate 128 to a liquid within the evaporator 134. The evaporator 134 is the same as the evaporator 22 in FIG. 1. Other components of a refrigeration cycle such as the components of the refrigeration cycle 16 of FIG. 1 are mounted within and to the docking station housing 114.

It should also be noted that the present invention has been described with reference to a temperature cycle arrangement including first and second resistive heaters 36 and 38 and first and second fans 40 and 42. Other temperature cycle arrangements may alternatively be used for purposes of thermally cycling an adsorber/desorber.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A computer system comprising:
   a mobile computer housing;
   a logic processor mounted to the mobile computer housing;
   a first refrigeration cycle including a condenser, an expansion valve, an evaporator, a first checkvalve, and a first adsorber/desorber located sequentially after one another, the evaporator being thermally coupled to the processor, the first adsorber/desorber adsorbing a fluid at a lower temperature and the first checkvalve being open to allow the fluid to flow from the evaporator through the first checkvalve to the first adsorber/desorber, and the first adsorber/desorber desorbing the fluid when being heated, the first checkvalve being closed so that a pressure of the fluid being desorbed increases before flowing through the condenser and the expansion valve back to the evaporator; and
   a second refrigeration cycle including the evaporator, a second checkvalve and a second adsorber/desorber sequentially after one another, the second adsorber/desorber desorbing a fluid at a lower temperature and the second checkvalve being open to allow the fluid to flow from the evaporator through the second checkvalve to the second adsorber/desorber, and the second desorber desorbing the fluid when being heated, the second checkvalve being closed so that a pressure of the fluid being desorbed increases before flowing back to the evaporator.

2. The computer system of claim 1 further comprising:
   a first heater which heats the first adsorber/desorber.

3. The computer system of claim 2 further comprising:
   a controller which controls the first heater so that the first heater alternately heats the first adsorber/desorber and allows the first adsorber/desorber to cool.

4. The computer system of claim 1 further comprising:
   a first fan which, upon rotation, cools the first adsorber/desorber.

5. The computer system of claim 1 wherein the fluid flows from the second adsorber/desorber sequentially through the condenser and the expansion valve back to the evaporator.

6. The computer system of claim 1 further comprising:
a temperature cycle arrangement which operates alternatingly in a first mode wherein the first adsorber/desorber is heated and the second adsorber/desorber is cooled and in a second mode wherein the first adsorber/desorber is cooled and the second adsorber/desorber is heated.

7. The computer system of claim 1 wherein the processor and refrigeration cycle are mounted to the mobile computer housing.

8. The computer system of claim 1 further comprising:
a docking station housing, the mobile computer housing being engageable with the docking station housing, the processor being mounted to the computer housing and the refrigeration cycle being mounted to the docking station housing.

9. The computer system of claim 1 further comprising:
a docking station housing, the mobile computer housing being engageable with the docking station housing, the processor being mounted to the mobile computer housing and the refrigeration cycle being mounted to the docking station housing.

10. The computer system of claim 1 further comprising:
a thermal plate on the docking station housing and thermally coupled to the evaporator;
a thermal plate on the mobile computer housing and thermally coupled to the logic processor, the thermal plates being in contact with one another when the mobile computer housing is engaged with the docking station housing and disengaged from one another when the mobile computer housing is disengaged from the docking station housing.

11. A computer system comprising:
a mobile computer housing;
a logic processor mounted to the mobile computer housing;
an evaporator thermally coupled to the logic processor;
a first checkvalve located in line after the evaporator;
a first adsorber/desorber located in line after the first checkvalve;
a condenser located in line after the first adsorber/desorber;
an expansion valve located in line after the condenser and line before the evaporator, wherein heat is transferred from the logic processor to a fluid in the evaporator, cooling of the first adsorber/desorber causing the first adsorber/desorber to adsorb fluid, adsorbing of the fluid reducing a pressure of the fluid being adsorbed so that the first checkvalve is opened, opening of the first checkvalve causing the fluid heated in the evaporator to flow through the first checkvalve and be adsorbed by the first adsorber/desorber, heating of the first adsorber/desorber causing the fluid adsorbed by the first adsorber/desorber to be desorbed from the first adsorber/desorber and an increase in pressure of the fluid, an increase in pressure of the fluid closing the first checkvalve to substantially prevent flow of the fluid back through the first checkvalve to the evaporator and a further increase in pressure of the fluid being desorbed, the fluid flowing from the first adsorber/desorber through the condenser to cool the fluid, whereafter the fluid is expanded by the expansion valve which causes a reduction in temperature of the fluid, whereafter the fluid flows into the evaporator, heat then again being transferred from the processor to the fluid in the evaporator;
a second checkvalve located in line after the evaporator; and
a second adsorber/desorber located in line after the second checkvalve, the fluid flowing sequentially from the evaporator through the second checkvalve, the second adsorber/desorber, the condenser and the expansion valve without flowing through the first checkvalve and the first adsorber/desorber.

12. The computer system of claim 11 further comprising:
a third checkvalve, between the first adsorber/desorber and the condenser, which substantially prevents flow of the fluid from the condenser to the first adsorber/desorber; and
a fourth checkvalve, between the second adsorber/desorber and the condenser, which substantially prevents flow of the fluid from the condenser to the second adsorber/desorber.

13. The computer system of claim 11, the mobile computer housing being engageable with the docking station housing, the processor being mounted to the computer housing and the refrigeration cycle being mounted to the docking station housing.

14. A method of cooling a logic processor of a mobile computer system, comprising:
transferring heat from the processor mounted to a mobile computer housing to a fluid in an evaporator;
adsorbing the fluid into a first adsorber/desorber;
closing a first valve between the evaporator and the first adsorber/desorber;
desorbing the fluid from the first adsorber/desorber, desorbing of the fluid causing an increase in pressure of the fluid;
cooling the fluid in a condenser;
expanding the fluid;
returning the fluid to the evaporator;
adsorbing the fluid into a second adsorber/desorber while the fluid is being desorbed from the first adsorber/desorber;
closing a second valve between the evaporator and the second adsorber/desorber; and
desorbing the fluid from the second adsorber/desorber.

15. The method of claim 14 wherein the fluid is desorbed from the second adsorber/desorber while the fluid is being adsorbed into the first adsorber/desorber.

16. The method of claim 14 and further comprising:
engaging a mobile computer housing with a docking station housing, the processor being mounted to the mobile computer housing and the evaporator being mounted to the docking station housing.

17. The method of claim 16 wherein components of a thermal plate on the mobile computer housing come into contact with a thermal plate on the docking station housing to couple the processor thermally to the evaporator.

18. A computer system comprising;
a mobile computer housing;
a logic processor mounted to the mobile computer housing;
a docking station housing, the mobile computer housing being releasably engageable with the docking station housing; and a refrigeration cycle mounted to the docking station housing, the refrigeration cycle including a condenser, an expansion valve, an evaporator, a first checkvalve, and a first adsorber/desorber located sequentially after one another, the evaporator being alternately (i) thermally coupled to the processor when the mobile computer housing is engaged with the docking station, and (ii) thermally disconnected from the processor when the mobile computer housing is disengaged from the docking station, the first adsorber/desorber adsorbing a fluid at a lower temperature and the first checkvalve being open to allow the fluid to flow from the evaporator through the first checkvalve to the first adsorber/desorber, and the first adsorber/desorber desorbing the fluid when being heated, the first checkvalve being closed so that a pressure of the fluid being desorbed increases before flowing through the condenser and the expansion valve back to the evaporator.

19. A method of cooling a logic processor of a mobile computer system, comprising:

engaging a mobile computer system housing with a docking station housing, a processor being mounted to the mobile computer housing and an evaporator being mounted to the docking station housing, a thermal plate on the mobile computer housing coming into contact with a thermal plate on the docking station housing;

transferring heat from the processor through the thermal plates to the evaporator;

adsorbing the fluid flowing from the evaporator into a first adsorber/desorber;

closing a first valve between the evaporator and the first adsorber/desorber;

desorbing the fluid from the first adsorber/desorber, desorbing of the fluid causing an increase in pressure of the fluid;

cooling the fluid in a condenser;

expanding the fluid; and returning the fluid to the evaporator.

* * * * *